(12) United States Patent
Gambetta et al.

(10) Patent No.: US 9,379,303 B2
(45) Date of Patent: Jun. 28, 2016

(54) MODULAR ARRAY OF FIXED-COUPLING QUANTUM SYSTEMS FOR QUANTUM INFORMATION PROCESSING

(75) Inventors: Jay M. Gambetta, Yorktown Heights, NY (US); Mark B. Ketchen, Hadley, MA (US); Chad T. Rigetti, Hopewell Junction, NY (US); Matthias Steffen, Cortlandt Manor, NY (US)

(73) Assignee: GLOCBALFOUNDRIES INC., Grand Cayman (KY)

( * ) Notice: Subject to any disclaimer, the term of this patent is extended or adjusted under 35 U.S.C. 154(b) by 1335 days.

(21) Appl. No.: 13/224,768

(22) Filed: Sep. 2, 2011

(65) Prior Publication Data

US 2012/0319684 A1   Dec. 20, 2012

Related U.S. Application Data

(60) Provisional application No. 61/497,018, filed on Jun. 14, 2011.

(51) Int. Cl.
| H01L 39/22 | (2006.01) |
| G01V 3/00 | (2006.01) |
| H01L 39/04 | (2006.01) |
| G06N 99/00 | (2010.01) |
| B82Y 10/00 | (2011.01) |

(52) U.S. Cl.
CPC ............... *H01L 39/04* (2013.01); *B82Y 10/00* (2013.01); *G06N 99/002* (2013.01)

(58) Field of Classification Search
None
See application file for complete search history.

(56) References Cited

U.S. PATENT DOCUMENTS

| 6,563,310 | B2* | 5/2003 | Zagoskin ............... B82Y 10/00 257/31 |
| 6,900,454 | B2 | 5/2005 | Blais et al. |
| 6,911,664 | B2 | 6/2005 | Il'ichev et al. |
| 7,042,005 | B2 | 5/2006 | Il'ichev et al. |
| 7,230,266 | B2* | 6/2007 | Hilton .................... B82Y 10/00 257/31 |
| 7,253,654 | B2* | 8/2007 | Amin ..................... B82Y 10/00 326/3 |
| 7,307,275 | B2 | 12/2007 | Lidar et al. |
| 7,364,923 | B2 | 4/2008 | Lidar et al. |
| 7,529,717 | B2* | 5/2009 | Vala ........................ B82Y 10/00 706/12 |
| 7,533,068 | B2 | 5/2009 | Maassen van den Brink et al. |
| 7,560,726 | B2* | 7/2009 | Beausoleil ........... G06N 99/002 257/13 |

(Continued)

FOREIGN PATENT DOCUMENTS

| CN | 1419660 A | 5/2003 |
| CN | 101401116 A | 4/2009 |

OTHER PUBLICATIONS

Zheng-Yuan Xue and Z. D. Wang, 2007, "Simple unconventional geometric scenario of one-way quantum computation with superconducting qubits inside a cavity," Physical Review A 75, 064303, 2007.*

(Continued)

*Primary Examiner* — Alexander H Taningco
*Assistant Examiner* — Nelson Correa
(74) *Attorney, Agent, or Firm* — Anthony Canale; Andrew M. Calderon; Roberts Mlotkowski Safran & Cole, P.C.

(57) ABSTRACT

A quantum information processing system includes a first composite quantum system, a second composite quantum system, a plurality of electromagnetic field sources coupled to the system and an adjustable electromagnetic coupling between the first composite quantum system and the second composite quantum system.

14 Claims, 4 Drawing Sheets

(56) References Cited

U.S. PATENT DOCUMENTS

| | | | |
|---|---|---|---|
| 7,800,395 B2 | 9/2010 | Johnson et al. | |
| 7,836,007 B2* | 11/2010 | Beausoleil | B82Y 10/00 706/62 |
| 7,876,145 B2* | 1/2011 | Koch | B82Y 10/00 327/186 |
| 7,876,248 B2 | 1/2011 | Berkley et al. | |
| 7,889,992 B1* | 2/2011 | DiVincenzo | G06N 99/002 398/115 |
| 7,893,708 B2* | 2/2011 | Baumgardner | G06N 99/002 326/2 |
| 8,111,083 B1* | 2/2012 | Pesetski | B82Y 10/00 326/3 |
| 8,642,998 B2* | 2/2014 | Gambetta | G06N 99/002 257/31 |
| 8,837,544 B2* | 9/2014 | Santori | B82Y 10/00 372/42 |
| 8,841,764 B2* | 9/2014 | Poletto | H01L 39/04 257/712 |
| 9,041,427 B2* | 5/2015 | Gambetta | H03K 17/92 326/3 |
| 2003/0193097 A1 | 10/2003 | Il'ichev et al. | |
| 2004/0140537 A1 | 7/2004 | Il'ichev et al. | |
| 2005/0224784 A1 | 10/2005 | Amin et al. | |
| 2006/0179029 A1 | 8/2006 | Vala et al. | |
| 2007/0215862 A1 | 9/2007 | Beausoleil et al. | |
| 2008/0274898 A1 | 11/2008 | Johnson et al. | |
| 2009/0028340 A1 | 1/2009 | Trifonov | |
| 2009/0074355 A1* | 3/2009 | Beausoleil | B82Y 10/00 385/27 |
| 2009/0289638 A1 | 11/2009 | Farinelli et al. | |
| 2010/0241780 A1 | 9/2010 | Friesen | |
| 2012/0319085 A1* | 12/2012 | Gambetta | G06N 99/002 257/31 |
| 2012/0319684 A1 | 12/2012 | Gambetta et al. | |
| 2012/0326720 A1 | 12/2012 | Gambetta et al. | |

OTHER PUBLICATIONS

International Search Report and Written Opinion for International Application No. PCT/US12/36440 filed May 4, 2012.
International Search Report and Written Opinion for International Application No. PCT/US12/36442 filed May 4, 2012.
E. Collin et al. "NMR-like Control of a Quantum Bit Superconducting Circuit," Phys. Rev. Lett. 93, 2004, 157005, 4 pages.
L. DiCarlo et al., "Preparation and Measurement of Three-Qubit Entanglement in a Superconducting Circuit," Nature, vol. 467, 2010, pp. 574-578.
F. Helmer et al., "Cavity grid for scalable quantum computation with superconducting circuits," Europhysics Letters. vol. 85, No. 5, 2009, 50007, 6 pages.
Houck et al., "Controlling the Spontaneous Emission of a Superconducting Transmon Qubit," Physical Review Letters, 101, 080502, 2008, pp. 1-4.
Houck et al., "Life after charge nosie: recent results with transmon qubits," Quantum Inf Process, 2009, pp. 105-115.
Koch et al., "Charge insensitive qubit design derived from the Cooper pair box," Physical Review A, 76, 042319, 2007, pp. 1-19.
H. Paik et al., "Investigating decoherence in the transmon qubit using a 3D resonator," Bulletin of the American Physical Society, vol. 56, No. 1, Mar. 21-25, 2011, Abstract Y29.00001.
C. Rigetti et al., "Fully Microwave-Tunable Universal Gates in Superconducting Qubits with Linear Couplings and Fixed Transition Frequencies," Phys. Rev. B., vol. 81, 2010, 134507, 7 pages.
C. Rigetti et al., "Protocol for universal gates in optimally biased superconducting qubits," Phys. Rev. Lett., vol. 94, 2005, 240502, 4 pages.
Chinese Office Action, CN Application No. 201280026434.8; Date Mailed: Oct. 10, 2015; pp. 1-5.
Chinese Office Action, CN Application No. 201280026664.4; Date Mailed: Oct. 20, 2015; pp. 1-3.

* cited by examiner

MODULAR ARRAY OF FIXED-COUPLING QUANTUM SYSTEMS FOR QUANTUM INFORMATION PROCESSING

CROSS-REFERENCE TO RELATED APPLICATIONS

Priority based on U.S. Provisional Patent Application, Ser. No. 61/497,018, filed Jun. 14, 2011, and entitled, "ARRAY OF THREE DIMENSIONAL SUPERCONDUCTING QUBIT/CAVITY CLUSTERS FOR QUANTUM COMPUTING", is claimed, the disclosure of which is incorporated by reference herein in its entirety. This application is related to U.S Patent applications entitled "ARRAY OF QUANTUM SYSTEMS IN A CAVITY FOR QUANTUM COMPUTING", filed on Sep. 2, 2011, having accorded Ser. No. 13/224,765 which is now U.S. Pat. No. 8,642,998, which is entirely incorporated herein by reference.

BACKGROUND

The present invention relates to quantum information processing, and more specifically, to a modular design for quantum information processing hardware based on an array of clusters of quantum systems.

Quantum information processing is a new paradigm of information processing where information is stored and processed with systems obeying the laws of quantum mechanics rather than classical mechanics. Such computers have been theoretically shown to be capable of solving important problems using exponentially fewer computational resources (e.g. operations, memory elements) than classical computers. As such, quantum physics provides a basis for achieving computational power to address certain categories of problems that are intractable with current machine computation.

By analogy with classical bits, the fundamental unit of quantum information is called the quantum bit, or qubit. In order to realize quantum information processing tasks, one must develop and implement a physical instantiation of a plurality of quantum bits. These physical instantiations are likewise referred to as quantum bits or qubits. The term 'qubit' is thus used in reference to the physical system realizing the instantiation and the unit of quantum information stored therein.

The physical quantum mechanical system realizing the instantiation of a qubit must possess at least two distinct and distinguishable eigenstates in order to represent at least two logic states. Instantiations where the number of distinct and distinguishable eigenstates is greater than two can be likewise used. These additional eigenstates may be explicitly used to represent additional logic states, or otherwise made use of for an information processing task. Specifically, additional eigenstates may be exploited to facilitate measurement of the two eigenstates encoding the two logic states; or to facilitate transformations of the Hilbert space associated to the two eigenstates encoding the two logic states.

Several physical systems and fields of physics have been proposed as potential frameworks and development grounds for quantum information processing. These include, but are not limited to: solid state nuclear spins, measured and controlled electronically or with nuclear magnetic resonance, trapped ions, atoms in optical cavities (cavity quantum-electrodynamics), liquid state nuclear spins, electronic charge or spin degrees of freedom in quantum dots, superconducting quantum circuits based on Josephson junctions and electrons on Helium.

Currently the most active areas of research towards quantum computing are superconducting qubits, trapped ions, trapped atoms, and quantum dots. The largest quantum computer built in any of these systems to date consists of around 10-16 qubits, and most implementations are focused on the demonstration of a specific quantum algorithm or quantum state.

The requirements for building a large-scale quantum computer are more intricate than quantum mechanical properties such as superposition and entanglement alone. There is a set of requirements that must be fulfilled in order to build a practical quantum computer. One requirement is to have a system of qubits that can be initialized to a known state. Another requirement is the ability to manipulate this state by applying single and multi-qubit gate operations such that any arbitrary logic operation can be implemented. Finally, the outcome of the computation must be measured through known techniques. In addition, for a quantum system to retain the delicately created superposition and entangled states for sufficiently long times (i.e., coherence times) it must be well isolated from the environment. However, in order to manipulate the quantum system according to the steps of the desired algorithm it must inherently also be coupled to the external environment thereby introducing noise mechanisms that reduce coherence times.

SUMMARY

Exemplary embodiments include a quantum information processing system including a first composite quantum system, a second composite quantum system, a plurality of electromagnetic field sources coupled to the system and an adjustable electromagnetic coupling between the first composite quantum system and the second composite quantum system.

Additional exemplary embodiments include a modular computing system, including a first qubit cluster, a second qubit cluster and a tunable coupler disposed between and coupling the first qubit cluster and second qubit cluster.

Additional exemplary embodiments include a quantum computing system, including a first qubit cluster having a first interaction strength, a second qubit cluster having a second interaction strength and a subcircuit disposed between the first qubit cluster and the second qubit cluster and configured to tune the first and second interaction strengths.

Additional exemplary embodiments include a quantum computing method, including applying an electromagnetic field to a plurality of qubits arranged in a waveguide cavity or any suitable quantum bus, adjusting the electromagnetic field to generate a quantum state in each qubit of the plurality of qubits and adjusting the electromagnetic field to couple each qubit of the plurality of qubits to one another.

Further exemplary embodiments include a quantum computing method, including generating a first electromagnetic field in a first housing having a first plurality of qubits, generating an second electromagnetic field in a second housing having a second plurality of qubits and generating a third electromagnetic field between the first housing and the second housing to couple the first plurality of qubits to the second plurality of qubits.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

The systems and methods described herein implement large collections (e.g., on the order of thousands and more) of coupled qubits in a modular system that can be modified, tested, characterized, assessed and operated as a smaller system. Each smaller subsystem can be localized and isolated from the remainder of the system for these purposes. Additional subsystems can be added to or removed from the full system without affecting the performance of the preponderance of the subsystems making up the full system. The systems and methods described herein are a framework for the construction, assembly, testing, characterization, assessment, and operation of a modular quantum computer.

In exemplary embodiments, the systems and methods described herein relate to a modular design for a quantum information processing system wherein the physical instantiations of qubits are arranged into two levels of physical organization and structure. These two levels are termed 'cluster' and 'array'.

The first level of structure is a 'cluster'. In exemplary embodiments, qubits are grouped into small clusters of approximately one to twenty qubits. Each qubit in a cluster is coupled, electromagnetically or otherwise, to at least one other qubit in the cluster. This coupling is enacted through a physical or electromagnetic structure or mechanism embedded within, near to, or serving as the housing of the cluster. In this way each cluster is imbued with qubit-qubit interactions between pairs of qubits comprising the cluster. Each cluster therefore forms a composite quantum system.

In exemplary embodiments, the systems and methods described herein implement tunable and adjustable elements: the structure mediating the intra-cluster qubit-qubit coupling is considered to be fixed on the time scale set by the coherent lifetime of a qubit within the cluster. Because tunability requires the coupling to the cluster of external field sources, the use of only fixed intra-cluster couplings during a computation allows the construction and operation of qubit clusters with only minimal connections to the external electromagnetic environment.

In this way, each cluster is predominantly electromagnetically isolated from the electromagnetic environment and from all other clusters except for the specific purpose of inducing interactions between clusters or for applying electromagnetic fields via external sources for the purpose of controlling, measuring or otherwise carrying out constituent processes which build up to form a quantum information processing task. Each cluster may therefore be regarded as an independent composite quantum system.

In exemplary embodiments, a second level of structure is an 'array'. A plurality of clusters as described above are arranged and connected to form an array of clusters. Each cluster is similar to each other cluster with respect to the physical instantiation of the qubits in the cluster. However, different clusters may have different numbers of qubits (though always in the range described above) and have slightly different or varying properties from one to another.

Each cluster in the array is coupled to at least one other cluster in the array through a physical or electromagnetic structure or mechanism that is tunable or adjustable in a manner so as to change the interaction strength between a qubit in one cluster and a qubit in the neighboring cluster on a time scale much faster than the typical coherent lifetime of qubits in two connected clusters.

As each cluster in the array is materially similar to each other cluster in the array, so each connection between a pair of clusters in the array is materially similar to each other connection between other pairs of clusters in the array.

When the mechanism controlling the interaction between two clusters is set to the OFF position, the strengths of the interactions between each of the qubits in the first cluster with the qubits in the second cluster are weaker than the time scale typical of the coherent lifetime of the qubits in the two connected clusters. In this way the interactions between neighboring clusters is such that when the interactions are set to the OFF position, each cluster forms a composite quantum system that remains independent of and isolated from the composite quantum system formed be each other cluster in the array. Each cluster may be characterized, tested, optimized and operated independent of each other cluster. In this way the exemplary embodiments described herein realize a modular quantum information processing system.

In exemplary embodiments, the systems and methods described herein implements clusters of qubits that include classically simulable number of quantum levels. Multiple clusters can be coupled together to generate an array of clusters that can be used for larger quantum computing applications. As described further herein, an array includes multiple clusters and a mechanism (i.e., a tunable coupler) that connects and disconnects each cluster from other clusters to which it is connected (i.e., neighboring clusters in the array). Each of the clusters in the array can be isolated from all other clusters for purposes of tune-up, test, characterization, assessment and operation. Each array therefore includes classically simulable (i.e., capable of being simulated on a modern classical computer) subsystems, connected to one another with a tunable coupler that effectively allows each subsystem to be isolated from all other subsystems in the array. As such, a quantum computer is built up and operated based upon the addition or connection of additional subsystems to the array. The systems and methods described herein also characterize, assess, and validate the performance of the quantum computer piecewise, consistent with classical computational limits to simulations of large quantum systems. The arrays described herein are therefore modular physical systems including clusters of qubits coupled to electromagnetic field sources and tunable couplers connected to electromagnetic or mechanical controls. The clusters of qubits each have fixed interaction strengths coupled to one another by a subcircuit (e.g., the tunable coupler) that tunes interaction strengths between clusters.

In exemplary embodiments, a quantum information processing system can include a first composite quantum system (e.g., a first qubit cluster), a second composite quantum system (e.g., a second qubit cluster), electromagnetic field sources coupled to the system and adjustable electromagnetic coupling between the first composite quantum system and the second composite quantum system. The composite quantum systems can each include a housing defining a cavity, quantum systems disposed in the cavity and an electromagnetic field source coupled to the cavity. Each of the composite quantum systems is coupled to an electromagnetic field source from the electromagnetic field source. In addition, the electromagnetic field source is configured to produce transformations or inhibit transformations of the quantum state of the first and second composite quantum systems. The electromagnetic field source is also configured to produce a projective quantum measurement of part or all of the composite quantum system. In exemplary embodiments, each of the first and second composite quantum systems includes one or more measureable attributes indicative of an aspect of the quantum state of the composite quantum system. In addition, each of the first and second composite quantum systems is coupled to an apparatus to facilitate measurement of an attribute of the composite quantum system indicative of the quantum state of the composite quantum system. Furthermore, an evolution and measurement of the system implements and executes at least one of a quantum information processing algorithm, task, and protocol. In exemplary embodiments, the system can include an electronic circuit disposed between the first composite quantum system and the second composite quantum system, thereby electromagnetically coupling the first system to the second system. In addition, the first composite quantum system and the second composite quantum system can be clusters of qubits, and the electromagnetic field source is configured to generate one or more quantum states in the clusters of qubits.

Figure 1:
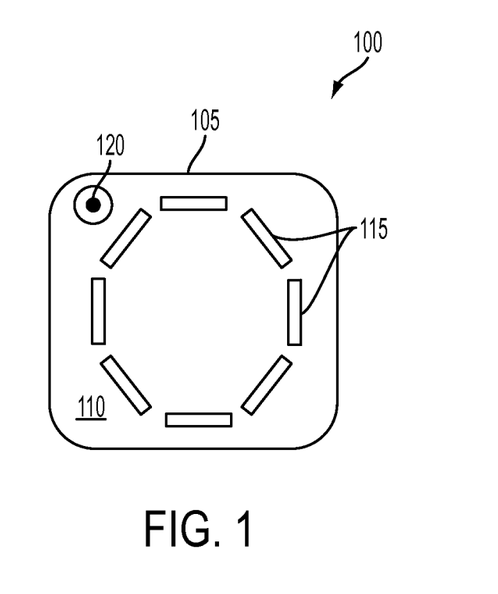
FIG. 1 illustrates an example of an exemplary three dimensional qubit cluster apparatus.

FIG. 1 illustrates an example of an exemplary qubit cluster apparatus 100. The apparatus 100 includes a housing 105 with a cavity 110 defined therein. The apparatus 100 can further include a cluster of qubits 115 disposed within the cavity 110. As described herein, an example of a superconducting Josephson junction is described as each of the qubits 115. However, as described herein, it is appreciated that any type of qubit can be implemented including but not limited to quantum dots, electron or nuclear spins or collections thereof. The apparatus 100 can further include an external electromagnetic source 120 (e.g., a coaxial cable) coupled to the housing 105 and providing an electromagnetic field within the cavity 110. As such, it can be appreciated that the housing 105 is an electromagnetic waveguide for the electromagnetic field applied to the housing 105. The qubits 115 can be arranged in a wide variety of ways within the cavity 110. The location and orientation of a qubit within the cavity can affect how strongly coupled it is to the cavity mode. Each qubit 115 can be viewed as a dipole, with an associated dipole moment vector. The strength of its interaction with the cavity 110 is determined predominantly by the dot product of the dipole moment vector with the electric field vector at the location of the qubit 115. As such, adjustments of the qubit location and orientation relative to the electric field profile of the mode of interest can be used to adjust the strength of qubit-cavity coupling, and in turn the qubit-qubit coupling, as the qubits acquire a direct qubit-qubit effective interaction through their mutual interaction with the cavity mode. The apparatus 100 is a scaled apparatus including multiple qubits 115. As such, the cavity 110 can support a high volume of electromagnetic modes, with strong coupling between the cavity 110 and the qubits. Furthermore, there is also strong coupling among the individual qubits 115 within the cavity that can be controlled and tuned by adjusting the electromagnetic field from the electromagnetic source 120. The apparatus 100 is therefore scaled up from the single 3D qubit to a large platform of coupled 3D qubits for quantum computing. In exemplary embodiments, the scaling up process is modular. FIG. 1 illustrates a single qubit cluster 100 as described. In exemplary embodiments, eight qubits 115 are illustrated and can be arranged in a variety of ways in order to achieve desired coupling among the qubits. It will be appreciated that there are numerous ways and manners in which the qubits 115 can couple. The qubits 115 are illustrated in an octagonal pattern but in no way are other exemplary embodiments limited to this pattern. Furthermore, there can be fewer or more than eight qubits 115 arranged in the cavity 110. Eight qubits 115 are illustrated because they behave much like a conventional NMR molecule, as further described herein, and therefore are well-understood and characterized.

As such, FIG. 1 illustrates superconducting qubits (e.g., eight transom-style qubits) inside the cavity 115, which, as described is an ultra-high Q superconducting waveguide resonator, to form the qubit cluster apparatus 100. In scaling up further, additional qubit cluster apparatuses can be coupled to the qubit cluster apparatus 100 as now described.

Figure 2:
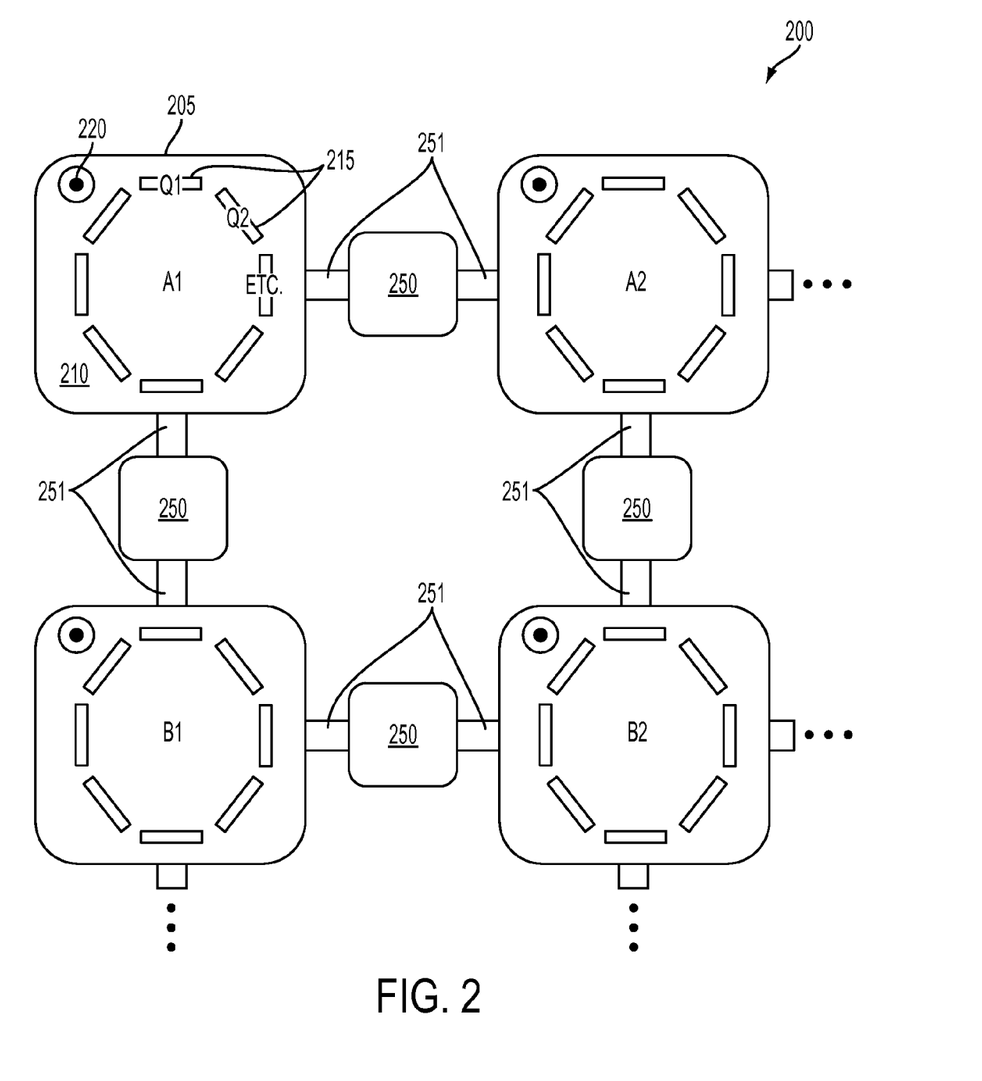
FIG. 2 illustrates an exemplary two-dimensional lattice multi-qubit system of multiple three dimensional qubit cluster apparatuses.

FIG. 2 illustrates an exemplary two-dimensional lattice multi-qubit system 200 of multiple 3D qubit cluster apparatuses A1, A2, B1, B2. The apparatuses A1, A2, B1, B2 are illustrative only, and can be scaled to a larger number of qubit cluster apparatuses such as a number of rows and columns on the order of A1-An, B1-Bm, where n and m are integers. Furthermore, each of the apparatuses A1, A2, B1, B2 includes similar structure of the apparatus 300 of FIG. 3. For example, the apparatus A1 includes a housing 205 with a cavity 210 defined therein. The apparatus A1 can further include a cluster of qubits 215 disposed within the cavity 210. The apparatus A1 can further include an external electromagnetic source 220 (e.g., a coaxial cable) coupled to the housing 205 and providing an electromagnetic field within the cavity 210. The system 200 further includes electromagnetic resonators 250 coupled between adjacent apparatuses A1, A2, B1, B2 via coupling elements 251 (e.g., transmission lines) coupling the cavities 210 to the electromagnetic resonators 250. The resonators 250 are coupled to the respective apparatuses A1, A2, B1, B2 via a suitable coupling device such as, but not limited to, a transmission line and a waveguide depending on the type of resonator implemented in the coupling. For example, the resonators 250 can be microwave resonators constructed from either lumped elements (explicit capacitances and inductors) or from a short section of transmission line. The transmission line could be coaxial, planar, waveguide, among others. These resonators are made tunable by incorporating into them some non-linear materials or circuit elements. An example of a non-linear circuit element would be a Josephson junction, which can behave like a tunable inductor. One possible design would be a transmission line resonator made from a short section of coplanar waveguide with Josephson junctions embedded in the center conductor or in the gap between the center conductor and the ground plane. Another resonator can include a superconducting loop interrupted by one or more Josephson junctions, which behaves like a magnetic field-dependent inductance. Regardless of the type of resonator implemented, the resonators 250 are tunable such that adjacent apparatuses A1, A2, B1, B2 are coupled to one another. By tuning the respective electromagnetic fields, groups of qubits in one apparatus A1, A2, B1, B2 can be coupled to an adjacent group of qubits in another of the apparatuses A1, A2, B1, B2. As such, not only are qubits coupled to their respective cavities and other qubits residing in their cavities, but groups of qubits can also be coupled in the entire system 200 as further described herein.

Figure 3:
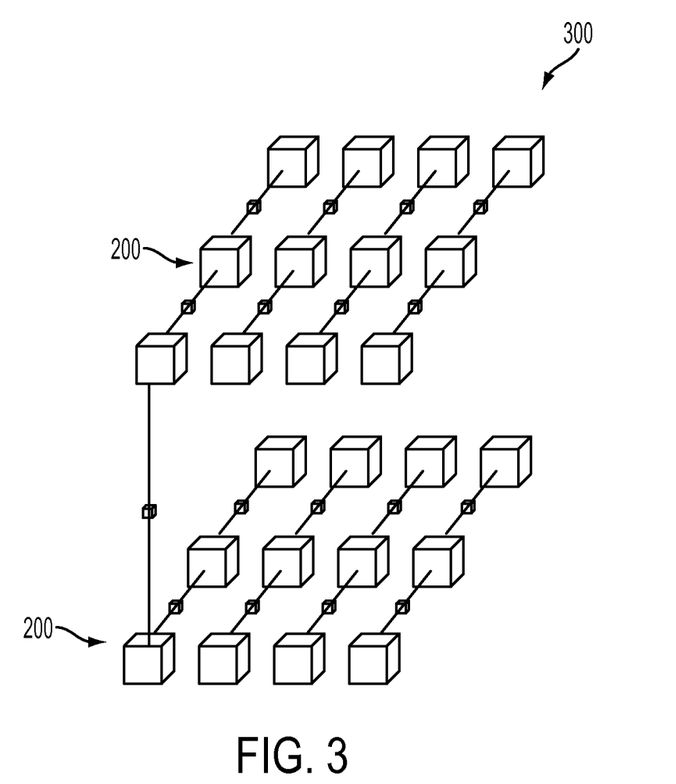
FIG. 3 illustrates an exemplary three-dimensional lattice multi-qubit system of multiple three-dimensional qubit cluster apparatuses.

The system 200 is capable of non-local entanglement, teleportation and error correction using the full multi-qubit system 200. At this point of scaling, other issues related to scaling can be addressed such as but not limited to thermalization, physical assembly, and signal delivery (i.e., I/O issues). It can be appreciated that the scaling from the 3D qubit apparatus 200 from FIG. 2 scales to the qubit cluster apparatus 300 of FIG. 3 and to the two dimensional array of these unit cells, as shown in FIG. 2(*b*), using nominally identical copies of the systems developed in the first two stages. Finally a number of two dimensional arrays can be stacked vertically to form a three dimensional array. FIG. 3 illustrates an exemplary 3D lattice multi-qubit system 300 of multiple 3D qubit cluster apparatuses as described herein. For illustrative purposes two of the systems 200 of FIG. 2 are shown. FIG. 3 is illustrated to further show scaling of the systems and methods described herein. It will be appreciated that additional systems 200 can be added to the system 300 to further scale the size of the quantum computer.

Figure 4:
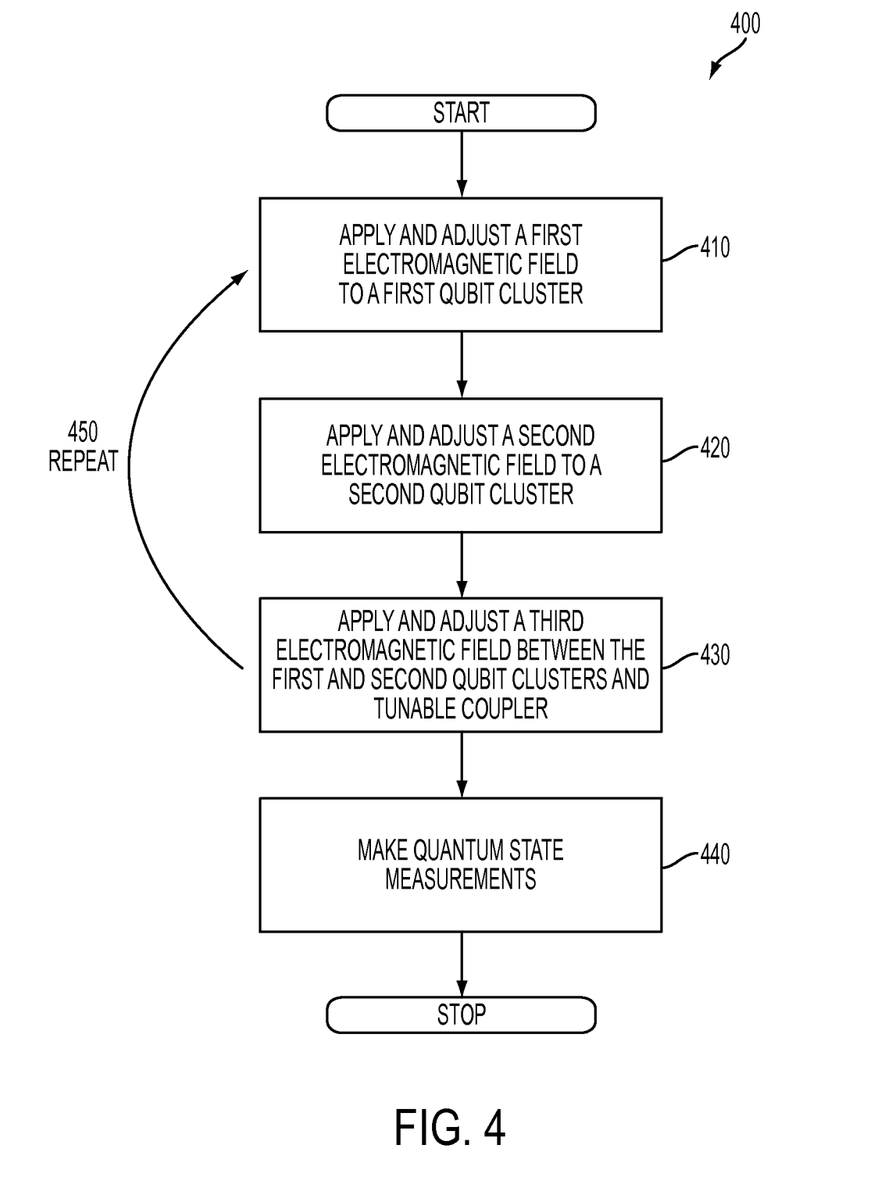
FIG. 4 illustrates a flow chart of a method for a quantum computing method in accordance with exemplary embodiments.

In exemplary embodiments, as described herein, the coupling of qubits within a cluster as well as coupling of individual qubits between clusters can be achieved by the application of electromagnetic fields. Measurements of the qubits can be subsequently taken in order to determine the quantum states of the qubits. The application of the electromagnetic fields as well as the subsequent quantum state measurements described an overall quantum computing method. FIG. 4 illustrates a flow chart of a method 400 for a quantum computing method in accordance with exemplary embodiments. At block 410, a first electromagnetic field can be applied and adjusted to a first qubit cluster (such as the apparatus A1 of FIG. 2). At block 420, a second electromagnetic field can be applied and adjusted to a second qubit cluster (such as the apparatus A2 of FIG. 2). As described herein, the application of the electromagnetic fields to the respective qubit clusters couples qubits within the clusters to one another as well as induces quantum states. At block 430, a third magnetic field can be applied and adjusted between the first and second qubit clusters (such as applying a resonating frequency from the resonator 250 disposed between the apparatuses A1, A2). For example, a third field is applied to the electromagnetic resonators 250 as well as apparatuses A1 and A2. As described herein, the application of the third magnetic field couples individual qubits within the first qubit cluster with individual qubits in the second qubit cluster, thereby coupling the qubit clusters. Blocks 410, 420 and 430 are repeated and modified during each iteration to execute a specific quantum algorithm or error correction scheme (block 450). At block 440, appropriate measurements of the quantum states of the qubits can be taken, such as by measuring the quantum flux of individual qubits.

Several properties of the exemplary systems and methods are now further described. As discussed herein, the physics of a system with multiple transom style qubits dispersively coupled to a single bosonic resonator mode is well understood (e.g., an NMRQC). In exemplary embodiments, the systems and methods described herein are implemented with fixed qubit frequencies and fixed qubit-qubit coupling. In this way, known NMR control techniques can be implemented. In NMR technology, Larmor frequencies are implemented in which the qubits tend to align with the applied electromagnetic fields. In addition, chemical shifts, which describe the dependence of energy levels on the electronic environment in a molecule, can be implemented to determine the dependence of the energy levels in a given cavity in the exemplary qubit clusters described herein. By implementing such known techniques, universal control of the exemplary qubit clusters described herein can be attained. In exemplary embodiments, qubit frequencies could be controlled via wires introduced into the cavity. By judicious selection of qubit frequencies and anharmonicities, Hamiltonians identical to Hamiltonians in NMR can be attained, where there are both secular and non-secular coupling terms of comparable strength, but only the secular portion is important because it enters to first order in perturbation theory. In exemplary embodiments, spins can be selected on individual qubits within a cavity.

In NMRQC, ZZ exchange and interaction describes the spin exchange between adjacent molecules. This concept can be extended to describe spin exchange in qubits as described in exemplary embodiments. An NMR-style Hamiltonian emerges when the effective ZZ interaction between qubits in a particular cavity is significant compared with the off-diagonal J-coupling term, that is, coupling of angular momentum of interacting qubits. This ZZ interaction has two physical origins. First, ZZ interaction emerges in the two-level approximation when the cavity-qubit coupling is treated to fourth-order in perturbation theory. Second, it emerges when additional qubit levels outside the computational subspace are properly modeled. The two effects can be made to add rather than cancel. In exemplary embodiments, the systems and methods described herein that include circuits that implement an NMR-type Hamiltonian requires understanding and exploiting both these origins of the ZZ interaction term. The strength of the effect increases rapidly as the 1-->2 transition of one qubit in a cluster approaches the 0-->1 transition of another. By exploiting these physical phenomena, the qubit clusters described herein can be scaled as described.

In exemplary embodiment, in order to produce the NMR-type Hamiltonian characterized by: a) fixed qubit transition frequencies, and b) fixed qubit-qubit couplings dominated by a ZZ interaction, the systems described herein possess the following qualities: 1) Each qubit is controlled and manipulated in such a manner that it behaves as an effective two-level system; 2) Each qubit interacts with at least one other qubit with a coupling energy that is much greater than the qubit relaxation and decoherence rates; 3) The system allows for the application to the qubits of a frequency and amplitude modulated microwave control field; and 4) The system allows for the readout of the quantum state of all qubits.

In exemplary embodiments, two qubit gates are performed by doing nothing to the two qubits that are to be entangled, while interactions between all other pairs are refocused. In recent liquid state NMR experiments on multi-spin molecules, very-high fidelity control of $E_{1q}=1.3\times10^{-4}$ and $E_{2q}=4.7\times10^{-3}$ has been demonstrated. It is believed that these are limited by the difficulty to polarize the spins at the outset. In contrast, in exemplary embodiments, the qubits described herein (i.e., superconducting qubits can be easily initialized. However, the higher Larmor frequencies (roughly 1-10 GHz as compared to 50-500 MHz), additional steps are taken to make accurate numerical pulse optimization.

In exemplary embodiments, qubits within the exemplary clusters described herein are measured through the application of resonant or near-resonant signals to the cavity that houses them. The readouts can be done according to the established methods of joint dispersive readout. Single shot readouts can be realized by also applying drive signals to a neighboring coupling element, whose non-linearity makes it suitable for signal amplification.

As such, it can be appreciated that the exemplary clusters described herein combine known and well-characterized features of NMRQC and desirable attributes of qubits such as superconducting attributes.

As further described herein, to go beyond the qubit clusters as illustrated in FIG. 3, for example, to larger arrays as described, for example in FIGS. 2 and 3, additional clusters are added. The exemplary systems 200, 300 as described in FIGS. 2 and 3 the high-Q tunable resonators (e.g., the resonator 250) mediates interactions between "identical" qubits in separate clusters. For example, in FIG. 2, some of the qubits 215 have been labeled Q1. The resonator 250 between the apparatuses A1, A2 can be tuned into resonance with one par of qubits (e.g., qubits A1Q1, A2Q1) to a frequency fq1. The application of this frequency fq1, results in an enhanced exchange of quantum information from qubits A1Q1 and A2Q1 to the coupling resonator 250 between the apparatuses A1, A2. Resonant enhancement of the qubit exchange rate into the resonator 250 rather than a suppression of the qubit relaxation is implemented. Each of the qubits A1Q1, A2Q2 interacts with the resonator according to the expression:

$$H_{eff} \approx g_c g_q (\sigma_q^- c^\dagger + \sigma_q^+ c)/\Delta_q$$

Where $g_c$ is the coupling strength between the resonator 250 and the cQED cluster cavity (i.e. either of the cavities 210 of the apparatuses A1, A2), $g_q$ and $\Delta_q$ are the standard cQED qubit-cavity coupling strength and detuning within the cluster of qubits 215, respectively, $\sigma_q$ is the qubit operator and c the resonator 250 operator. When the apparatuses A1, A2 and the resonator 250 are resonant, the qubit-qubit interaction proceeds at half this rate, or $g_c g_q/2 \Delta_q$. With currently demonstrated tunable cavity performance this coupling scheme between qubits in separate cavities can produce an operation with a gate error rate of $10^{-2}$, and it increases linearly with any improvements in the Q of the tunable resonator 250. It has been theorized that the gate error rate can be increased by up to a factor of 5 to 10.

In exemplary embodiments, when the resonator 250 is detuned residual coupling acts only via a third-order dispersive coupling through each of the apparatuses A1, A2 and the resonator 250, an effect proportional to:

$$H_{eff}^{off} \approx g_c^2 g_q^2 (\sigma_a^- \sigma_b^+ + \sigma_a^+ \sigma_b^-)/\Delta_q^2 \Delta_c^{off}$$

The on/off ratio of this tunable coupling is thus:

$$H_{eff}^{off} \approx \Delta_q \Delta_c^{off}/g_c g_q$$

which is 100-1000 for accessible parameters.

As described herein, many different types of resonators can be implemented for the resonator 250. For example, a basic tunable coupling element used to intermediate interactions between qubits of neighboring clusters (e.g., apparatuses A1, A2) can include Josephson junctions embedded within the mode volume of either 2D or 3D resonator structures and applying bias fields. This tunable coupler could be a passive but tunable device, such as a frequency tuned resonator; or it could be an active device such as a Josephson parametric converter, which frequency converts with gain dependent on the pump power. Presently available technologies have achieved tunable resonators with $Q_{tunable} = 3 \times 10^4$. Lossless Josephson frequency converters can also be implemented as the resonator 250. Lossless Josephson frequency converters can act as frequency converters with gain that depends on the applied pump power, and thus possesses the possibility to produce very strong cluster-cluster coupling with a greater on/off ratio. Lossless Josephson frequency converters could also be implemented as a readout element capable of single shot projective joint readout, a valuable resource for quantum error correction schemes.

In exemplary embodiments, scaling can further include not only the adjacent apparatuses A1, A2 as just described, but also the full 2D arrangement including the apparatuses B1, B2 as shown in FIG. 2. In exemplary embodiments, a 2×2 array of clusters (e.g., apparatuses A1, A2, B1, B2) can be implemented for quantum computing by coupling nearest neighbors, via intervening resonators 250. Similarly, any 3×3 array or larger, and any 3D array as shown in FIG. 3 can further be developed implementing resonators 250 to couple nearest neighbors. In these examples, a 2×2 array can include 32 qubits, a 3×3 array can include 72 qubits, an 8×8 array can include 512 qubits and so on, thus demonstrating the quantum computing capabilities. This scaling approach advantageously includes modular repeated units that exploit known and demonstrated physics as described herein and reduces the I/O challenges because one control line can be implemented per qubit cluster, for example.

The examples illustrated in FIGS. 1-3 show an exemplary arrangement of qubits. It can be appreciated that the qubit clusters can be arranged in other lattice structures, such as trigonal, hexagonal or other. They can also be extended to three-dimensional lattices, (e.g. the cubic lattice of FIG. 3). Whether the qubit clusters are arranged in a 1D, 2D or 3D lattice, the physical structures can be arranged to occupy a 3D volume to facilitate IO issues or for other reasons. In the case of a 3D cubic lattice of FIG. 3, two dimensional square lattice sheets can be connected two each other by additional tunable resonators in any of several ways, for example to form topologically a large extended two dimensional array or a truly three dimensional array with each interior qubit cluster connected to its six nearest neighbors, four in the same plane and one each directly above and below.

Technical effects include the implementation of clusters of qubits arranged to couple individual qubits for quantum computing.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A quantum information processing system comprising:
 a first composite quantum system comprising a first housing defining a first cavity therein, and a first plurality of qubits positioned in the first cavity;
 a second composite quantum system comprising a second housing defining a second cavity therein, and a second plurality of qubits positioned in the second cavity;
 a plurality of electromagnetic field sources coupled to the systems; and
 an adjustable electromagnetic coupling between the first composite quantum system in the first housing and the second composite quantum system in the second housing.

2. The system as claimed in claim 1 wherein each of the composite quantum systems is coupled to an electromagnetic field source from the plurality of electromagnetic field sources.

3. The system as claimed in claim 2 wherein the electromagnetic field source is configured to produce transformations of the quantum state of the first and second composite quantum systems.

4. The system as claimed in claim 2 wherein the electromagnetic field source is configured to inhibit transformations of the quantum state of the first and second composite quantum systems.

5. The system as claimed in claim 2 wherein the electromagnetic field source is configured to produce a projective quantum measurement of part or all of the composite quantum system.

6. The system as claimed in claim 1 wherein each of the first and second composite quantum systems includes one or more measureable attributes indicative of the quantum state of the composite quantum system.

7. The system as claimed in claim 1 wherein each of the first and second composite quantum systems is coupled to an apparatus to facilitate measurement of an attribute of the composite quantum system indicative of the quantum state of the composite quantum system.

8. The system as claimed in claim 2 wherein an evolution and measurement of the system implements and executes at least one of a quantum information processing algorithm, task, and protocol.

9. The system as claimed in claim 1 further comprising an electronic circuit disposed between the first composite quantum system and the second composite quantum system, thereby electromagnetically coupling the first system to the second system.

10. The system as claimed in claim 1 further comprising an electromagnetic field source coupled to the adjustable electromagnetic coupling.

11. The system as claimed in claim 1, wherein the first plurality of qubits is arranged such that modes associated with each qubit of the first plurality of qubits couple with one another, and wherein the second plurality of qubits is arranged such that modes associated with each qubit of the second plurality of qubits couple with one another.

12. The system as claimed in claim 1, wherein the electromagnetic field source is configured to generate one or more quantum states in each of the plurality of qubits.

13. A modular computing system, comprising:
 a first qubit cluster comprising a first housing defining a first cavity therein, and a first plurality of qubits positioned in the first cavity;
 a second qubit cluster comprising a second housing defining a second cavity therein, and a second plurality of qubits positioned in the second cavity; and
 a tunable coupler disposed between and coupling the first qubit cluster and second qubit cluster.

14. The computing system of claim 13, wherein the first qubit cluster has a first interaction strength;
 wherein the second qubit cluster has a second interaction strength; and
 wherein the tunable coupler is configured to tune the first and second interaction strengths.

* * * * *